(12) United States Patent
Hase

(10) Patent No.: US 6,872,995 B2
(45) Date of Patent: Mar. 29, 2005

(54) FERROELECTRIC CAPACITOR, METHOD OF MANUFACTURING SAME, AND SEMICONDUCTOR MEMORY DEVICE

(75) Inventor: Takashi Hase, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 79 days.

(21) Appl. No.: 10/423,974

(22) Filed: Apr. 28, 2003

(65) Prior Publication Data

US 2003/0213985 A1 Nov. 20, 2003

(30) Foreign Application Priority Data

May 17, 2002 (JP) ........................................ 2002-142534

(51) Int. Cl.[7] .............................................. H01L 29/76
(52) U.S. Cl. ........................ 257/295; 257/310; 257/532
(58) Field of Search ................................ 257/295, 296, 257/306, 310, 532, 379, 277, 516; 361/303, 305

(56) References Cited

U.S. PATENT DOCUMENTS

| | | | | | |
|---|---|---|---|---|---|
| 5,864,153 A | * | 1/1999 | Nagel et al. | ................. | 257/296 |
| 6,454,914 B1 | * | 9/2002 | Nakamura | ............. | 204/192.17 |
| 2002/0070404 A1 | * | 6/2002 | Bruchhaus et al. | ......... | 257/310 |

* cited by examiner

Primary Examiner—Minh-Loan Tran
(74) Attorney, Agent, or Firm—Young & Thompson

(57) ABSTRACT

A ferroelectric capacitor has the property that polarization of a ferroelectric thin film can readily be reversed and polarization-reversal charge increased. The ferroelectric capacitor has a bottom electrode, a ferroelectric thin film and a top electrode. The top electrode includes a metal crystalline phase and 0.5 to 5 atm % interstitial oxygen atoms in the metal crystalline phase.

19 Claims, 12 Drawing Sheets

FERROELECTRIC CAPACITOR, METHOD OF MANUFACTURING SAME, AND SEMICONDUCTOR MEMORY DEVICE

FIELD OF THE INVENTION

The present invention generally relates to a ferroelectric capacitor and method of manufacturing the same, and more particularly to a ferroelectric capacitor in which polarization of a ferroelectric thin film can be reversed with facility and the charge of polarization reversal increased, and to a method of manufacturing this ferroelectric capacitor.

BACKGROUND OF THE INVENTION

A ferroelectric material is such that once an electric field is applied to cause polarization, the hysteresis characteristics thereof is maintained even if the power supply is cut off. A ferroelectric capacitor, which is formed as a three-layer structure composed of a metal layer, a ferroelectric thin film and a metal layer, is employed as a non-volatile memory by utilizing the polarization characteristics of such a ferroelectric material. Methods of enhancing the performance of a ferroelectric capacitor are increasing the remanent polarization, lowering the operation voltage, lowering the film deposition temperature of the ferroetectric thin film, and improving endurance to repetitive polarization reversal.

In the typical structure of a ferroelectric capacitor, as shown in FIG. 12, a bottom electrode 105, a ferroelectric thin film 106 and a top electrode 107 are formed on a substrate 101 in the order mentioned. A composite oxide film having a perovskite structure such as PZT ($PbZr_xTi_{1-x}O_3$), PLZT ($Pb_{1-y}La_yZrxTi_{1-x}O_3$) or SBT ($SrBi_2Ta_2O_9$) is used as the ferroelectric thin film 106. A metal (alloy) comprising one or more metals selected from the group composed of Ru, Rh, Pd, Os, Ir, Pt, Au and Ag, which are highly oxidation resistant under high temperatures, or an electrically conductive oxide comprising one or more oxides selected from the group composed of RuOx, ReOx, RhOx, IrOx and OxOx, is used as the bottom electrode 105 and top electrode 107 of the conventional ferroelectric capacitor. Suppressing degradation of polarization in a case where such metals or conductive oxides is used as the bottom electrode 105 and top electrode 107 is achieved because it is possible to suppress loss of oxygen in the ferroelectric at the ferroelectric-electrode interface.

SUMMARY OF THE DISCLOSURE

However, in a case where a metal or alloy (that does not contain oxygen) is used as the bottom electrode or top electrode, as in the conventional ferroelectric capacitor, oxygen cannot be compensated for when loss of oxygen occurs at the surface of the ferroelectric thin film, the remanent polarization of the ferroelectric decreases or insulation failure occurs, resulting in an increase in leakage current.

Further, in a case where a conductive oxide is used as the bottom electrode or top electrode, oxygen from the top electrode to the ferroelectric thin film can be compensated for the loss of oxygen at the surface of the ferroelectric thin film. However, often the absolute value of remanent polarization decreases. This is because that oxygen readily reacts with the constituent elements (especially Pb) of the ferroelectric and with the metal in the electrodes and reaction products other than a ferroelectric material are formed at the interface between the electrodes and ferroelectric thin film. As a result, remanent polarization of the ferroelectric decreases and the insulation characteristics of the capacitor are degraded.

Accordingly, it is an object of the present invention to provide a ferroelectric capacitor in which polarization of a ferroelectric thin film can be reversed with facility and the charge of polarization reversal increased, and to a method of manufacturing this ferroelectric capacitor.

The above and other objects are attained by a ferroelectric capacitor in accordance with an aspect of the present invention, which has a bottom electrode (5), a ferroelectric thin film (6) and a top electrode (7) which comprises an RU metal crystalline phase and 0.5 to 5 atm % interstitial oxygen atoms in the Ru metal crystalline phase.

A ferroelectric capacitor according to another aspect of the present invention, has a bottom electrode, a ferroelectric thin film and a top electrode, wherein either one or both of the top electrode and bottom electrode comprises an RU metal crystalline phase and 0.5 to 5 atm % interstitial oxygen atoms in the Ru metal crystalline phase.

A ferroelectric capacitor according to a further aspect of the present invention, has a bottom electrode, a ferroelectric thin film and a top electrode, which is a metal that has a metal crystalline phase, contains oxygen and is devoid of a metal oxide crystalline phase.

A ferroelectric capacitor according to a further aspect of the present invention, has a bottom electrode, a ferroelectric thin film and a top electrode, wherein either one or both of the top electrode and bottom electrode is a metal that has a metal crystalline phase, contains oxygen and is devoid of a metal oxide crystalline phase.

In the ferroelectric capacitor according to the present invention, a main component of the metal preferably is one or more elements selected from the platinum family of elements, and more preferably is one or more elements selected from Ir and Ru.

Further, in the ferroelectric capacitor according to the present invention, the ferroelectrics preferably has, as its main component, a composite oxide film having a perovskite structure, and more preferably has, as its main component, a ferroelectric of $Pb(Zr_xTi_{1-x})O3$ or a composition obtained by adding an additive such as La, Ba, Ca, Nb, Ta or Mn thereto.

Further, in the ferroelectric capacitor according to the present invention, the bottom electrode, ferroelectric thin film and top electrode preferably are built up on an area that includes a step portion or trench formed in a substrate.

According to another aspect of the present invention, the above and other objects are attained by providing a semiconductor memory device having one or more of the above-described ferroelectric capacitors according to the present invention.

The above and other objects are attained by a method of manufacturing a ferroelectric capacitor, according to one aspect of the invention, the capacitor having a bottom electrode, a ferroelectric thin film and a top electrode. This method comprises a step of controlling flow-rate ratio of inert gas to oxygen gas when an electrode layer is formed by sputtering of an Ru metal target in an atmosphere that contains oxygen, thereby controlling X in $Ru_{1-x}O_x$, which is formed as the electrode layer, to a value equal to or greater than 0.005 and equal to or less than 0.05 (the oxygen content of the Ru metal is controlled to a value of 0.5 to 5 atm %).

According to another aspect of the present invention, a method of manufacturing a ferroelectric capacitor having a bottom electrode, a ferroelectric thin film and a top electrode, comprises a step of controlling flow-rate ratio of inert gas to oxygen gas when an electrode layer is formed by sputtering of a metal target in an atmosphere that contains oxygen, thereby controlling the oxygen content of a metal thin film formed as the electrode layer.

According to a further aspect of the present invention, a method of manufacturing a ferroelectric capacitor having a bottom electrode, a ferroelectric thin film and a top electrode, comprises a step of controlling supplied amount of oxidizing gas when an electrode layer is formed by causing a gaseous phase reaction between supplied organic metal material and oxidizing gas, thereby controlling the oxygen content of a metal thin film formed as the electrode layer.

In the method of manufacturing the ferroelectric capacitor, the ferroelectric capacitor thin film preferably is formed at a temperature of 500° C. or less, and more preferably at a temperature of 450° C. or less.

In the method of manufacturing the ferroelectric capacitor, the ferroelectric capacitor thin film preferably is formed by the MOCVD method or sputtering method. Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Preferred embodiments of the present invention will now be described in detail.

In a ferroelectric capacitor device, according to one preferred embodiment of the present invention, which has a bottom electrode (5 in FIG. 1), a ferroelectric thin film (6 in FIG. 1) and a top electrode (7 in FIG. 1), the top electrode (7 in FIG. 1) preferably comprises $Ru_{1-x}O_x$ (where X is equal to or greater than 0.005 and equal to or less than 0.05) and has an Ru metal crystalline phase. If the content of oxygen in the Ru metal composing top electrode is equal to or greater than 0.5 atm % (in Ru1-xOx, x is equal to or greater than 0.005), the oxygen loss in the surface (interface) of the ferroelectric thin film may well be compensated. If the content of oxygen in the Ru metal composing top electrode is equal to or less than 5 atm % (in Ru1-xOx, x is not more than 0.05), the generation of reaction products among the top electrode, oxygen and an element composing the ferroelectric thin film is suppressed to avoid the decrease of remanent polarization of the ferroelectric film and the increase of leakage current.

Accordingly, if the oxygen content in the Ru metal composing the top electrode is set in the range of 0.5–5 atm % (Ru1-xOx: where x is 0.005–0.05), in the vicinity of the interface of the ferroelectrics, the crystalline perfection (a perfect crystalline structure) is improved by the oxygen compensated and hence the polarization increases. The top electrode has an Ru metal crystalline phase and hence the Schottky barrier-height is increased to cause the leakage current to be kept to a small level.

In the present embodiment, an oxygen element contained in the top electrode is present as an interstitial atom in the metal crystalline phase and has a weak bonding, and hence the oxygen element in the metal crystalline phase can more easily move than that contained in a metal oxide. The oxygen atom is easily supplied into the ferroelectrics, and compensation effect of oxygen in the surface of the ferroelectrics is extremely enhanced. These properties are effective for the ferroelectric film which is deposited at a low temperature and the polarization value of which is small (the polarization write voltage being low).

A first embodiment of the present invention will be described with reference to FIG. 1, which is a partial sectional view schematically illustrating the structure of a ferroelectric capacitor according to the first embodiment.

Figure 1:
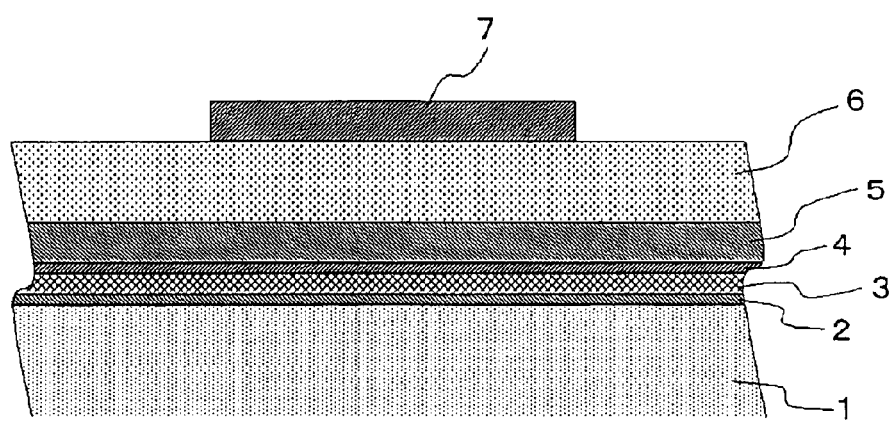
FIG. 1 is a partial sectional view schematically illustrating the structure of a ferroelectric capacitor according to a first embodiment of the present invention.

As shown in FIG. 1, an oxide ferroelectric capacitor has buffer layers 2, 3, and 4, a bottom electrode 5, a ferroelectric thin film 6 and a top electrode 7 on a substrate 1 (the surface of which has a silicon-oxide film). The buffer layers are laminated layers made up of a Ti layer 2, TiN layer 3 and Ti layer 4 in order starting from the substrate side. The Ti layers 2 and 4 are for the purpose of improving adhesion to the neighboring films. The bottom electrode 5 is an electrode, which comprises Ru metal, formed on the buffer layer (Ti layer) 4 and below the ferroelectric thin film 6. The ferroelectric thin film 6 is PZT ($PbZr_{0.37}Ti_{0.63}O_3$) formed on the bottom electrode 5. The top electrode 7, which is formed on the ferroelectric thin film 6, comprises Ru metal which has a metal crystalline phase and includes 0.5 to 5 atm % oxygen ($Ru_{1-x}O_x$; X=0.005 to 0.05).

A method of manufacturing the ferroelectric capacitor according to the first embodiment will now be described.

FIGS. 2A, 2B, 2C, 2D, 2E and 2F are partial process sectional views schematically illustrating an arrangement useful in describing a method of manufacturing the ferroelectric capacitor according to the first embodiment.

Figure 2A:
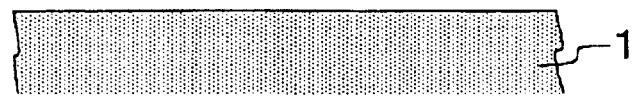
FIGS. 2A, 2B, 2C, 2D, 2E and 2F are partial process sectional views schematically illustrating an arrangement useful in describing a method of manufacturing the ferroelectric capacitor according to the first embodiment.
Figure 2B:
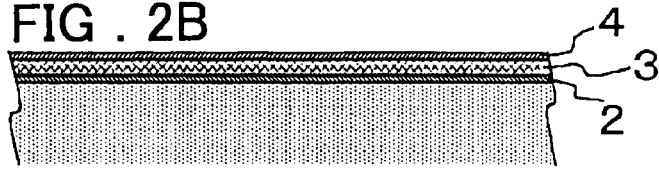

First, the buffer layer 2, 3 and 4 are laminated on the substrate 1 having a silicon-oxide film on the surface thereof [see FIG. 2B]. The buffer layers are formed as the Ti layer 2, TiN layer 3 and Ti layer 4 in the order mentioned. The film thicknesses of the Ti layer 2, TiN layer 3 and Ti layer 4 are, for example, on the order of 20 nm, 50 nm and 20 nm, respectively. Each layer of the buffer layers 2, 3 and 4 is formed using well-known film forming conditions and method (for example sputtering). Furthermore, the Ti layer 2, TiN layer 3 and Ti layer 4 have polycrystalline structures.

Figure 2C:
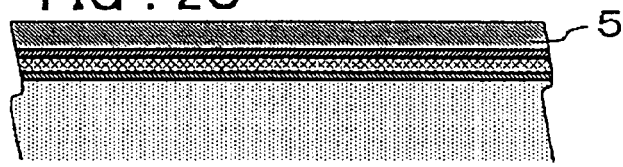

Next, the bottom electrode layer 5 is formed as a film on the buffer layer (Ti layer) 4 [see FIG. 2C]. The bottom electrode layer 5 is formed as a thin film by fabricating an Ru metal thin film using the sputtering method. The film forming conditions of the bottom electrode layer 5 are as indicated in Table 1 below. The Ru metal thin film is composed of a poly crystal of Ru.

TABLE 1

FILM FORMING CONDITIONS OF BOTTOM ELECTRODE LAYER

| | |
|---|---|
| TARGET | Ru |
| PRESSURE | 8 mTorr (1.1 Pa) |
| ATMOSPHERE | Ar; 45 sccm |
| TEMPERATURE | ABOUT 300° C. |
| POWER | 2 kW |
| DISTANCE FROM TARGET | ABOUT 100 mm |
| SPUTTERING RATE | ABOUT 150 nm/min |
| FILM THICKNESS | ABOUT 100 nm |

Figure 2D:
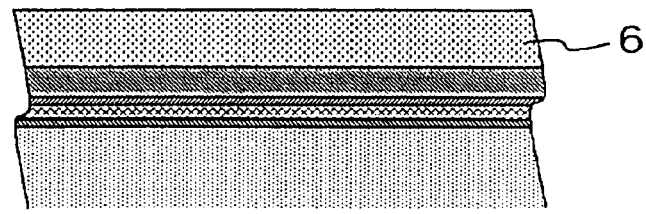

Next, the ferroelectric thin film 6 is formed on the surface of the bottom electrode layer 5 [see FIG. 2D]. The ferroelectric thin film 6 has PZT as its main component and is fabricated using the MOCVD (molecular organic chemical vapor deposition) method. The film forming conditions of the ferroelectric thin film is as set forth below.

The source gases are $Pb(DPM)_2$ gas heated to 180° C., $Zr(O\text{-}tBu)_4$ gas heated to 80° C., and $Ti(O\text{-}iPr)_4$ gas heated to 85° C. These source gases flow into a deposition chamber via a heated mass-flow controller and piping without using a carrier gas, and is then supplied onto the substrate surface from a shower head heated to 200° C. An oxidizing gas that oxidizes the source gases is $NO_2$ gas. Though the oxidizing gas is similarly supplied onto the substrate surface from the shower head, the interior of the shower head is partitioned in such a manner that the oxidizing gas will not mix with the source gases. The pressure applied in the deposition chamber is about 6.7 Pa. The deposition temperature (that is, substrate temperature) is 450° C. Here a $PbTiO_3$ (referred to as "PTO" below) nuclei (seed crystal) is fabricated before the PZT in such a manner that the PZT will crystallize sufficiently even at 450° C.

The process for forming the ferroelectric thin film will now be described in detail.

After the substrate temperature of the MOCVD apparatus is set to 450° C. and the substrate on which the bottom electrode layer 5 has been formed is transported into the deposition chamber, the flow rate of the $NO_2$ gas is set to 20 sccm, the flow rate of the $Pb(DPM)_2$ gas to 0.18 sccm and the flow rate of the $Ti(O\text{-}iPr)_4$ gas to 0.24 sccm, and the gases are supplied simultaneously to fabricate the PTO nuclei in 20 s. The flow rate of the $NO_2$ gas is set to 20 sccm, the flow rate of the $Pb(DPM)_2$ gas to 0.18 sccm, the flow rate of $Zr(O\text{-}tBu)_4$ gas to 0.15 sccm and the flow rate of the $Ti(O\text{-}iPr)_4$ to 0.14 sccm, and the gases are supplied simultaneously to fabricate PZT to a film thickness of about 250 nm. As a result, the ferroelectric thin film 6 having PZT as its main component is formed.

Next, the substrate on which the ferroelectric thin film 6 has been formed is annealed. The annealing conditions are as set forth in Table 2 below. As a result, the crystal quality of the ferroelectric thin film is improved.

TABLE 2

ANNEALING CONDITIONS (AFTER FORMATION OF FERROELECTRIC THIN FILM)

| | |
|---|---|
| TEMPERATURE | 400° C. |
| ATMOSPHERE | OXYGEN (100%) |
| PRESSURE | ABOUT 1 atm (1 × $10^5$ Pa) |
| TIME | 10 min |

Figure 2E:
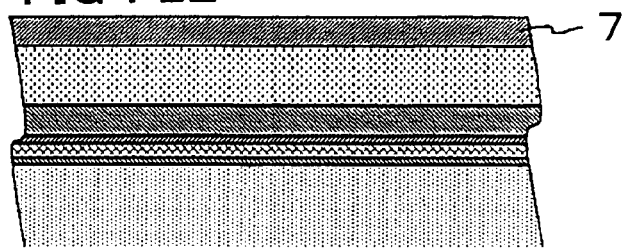

Next, the top electrode layer 7 is formed as a film on the surface of the ferroelectric thin film 6 on the annealed substrate [see FIG. 2E]. The top electrode layer 7 is formed by fabricating an Ru metal thin film using a sputtering method in an atmosphere in which the oxygen ratio has been controlled. The conditions for forming the top electrode layer 7 are as set forth in Table 3 below.

TABLE 3

FILM FORMING CONDITIONS OF TOP ELECTRODE LAYER

| | |
|---|---|
| TARGET | Ru |
| PRESSURE | 8 mTorr (1.1 Pa) |
| ATMOSPHERE (FLOW RATE) | TOTAL: 45 sccm |
| | Ar: 10 to 45 sccm |
| | $O_2$: 0 to 30 sccm |
| TEMPERATURE | 300° C. |
| POWER | 2 kW |
| DISTANCE FROM TARGET | ABOUT 100 mm |
| SPUTTERING TIME | 36 min |
| FILM THICKNESS | ABOUT 100 nm |

Figure 2F:
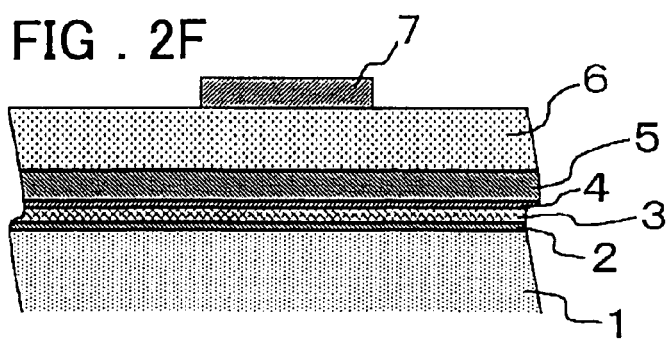

Next, only the top electrode layer 7 is dry-etched into a 100 μm square pattern[see FIG. 2F]. In this step, a resist pattern (not shown) is formed by lithography, the top electrode layer 7 is dry-etched (etching gas: $Ar/Cl_2$; temperature: 80° C.) using the resist pattern as an etching mask, and the resist pattern is removed by ashing (240° C., 150 s). As a result, a parallel-plate type capacitor having a capacitor area of 10,000 μm² can be produced.

Finally, the substrate on which the capacitor has been formed is annealed. The annealing conditions are as set forth in Table 4 below. As a result, the crystal quality of the ferroelectric thin film is improved.

TABLE 4

ANNEALING CONDITIONS (AFTER FORMATION OF CAPACITOR)

| | |
|---|---|
| TEMPERATURE | 400° C. |
| ATMOSPHERE | NITROGEN (100%) |
| PRESSURE | ABOUT 1 atm (1 × $10^5$ Pa) |
| TIME | 10 min |

A test of polarization characteristics of the ferroelectric capacitor according to the first embodiment will be described next.

Tests of polarization characteristics conducted are (1) a test of initial-state characteristics and (2) a test of polarization-reversal cycle characteristics.

Figure 3:
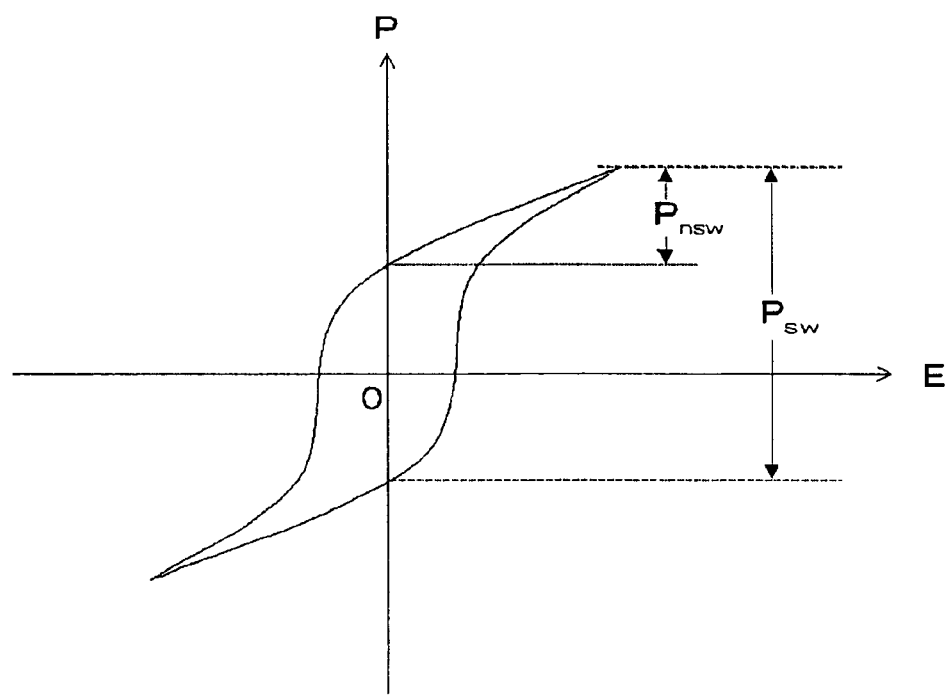
FIG. 3 is a schematic view showing a hysteresis loop useful in describing charge ($P_{sw}$) at the time of polarization reversal and charge ($P_{nsw}$) at the time of polarization reversal.

The test of initial-state characteristics will be described first. In the test of initial-state characteristics, the following were measured with regard to the initial state (polarization-reversal cycle) of a sample (ferroelectric capacitor):

(1) the oxygen content of the top electrode (the value of X in $Ru_{1-x}O_x$);

(2) the difference (which corresponds to a value that is twice the remanent polarization) between charge at the time of polarization reversal (charge when +3 V has been applied after applying −3 V; see $P_{sw}$ in FIG. 3) and charge at the time of polarization reversal (charge when +3 V has been re-applied after applying +3 V; see $P_{nsw}$ in FIG. 3); and (3) leakage current density when 3V is applied.

Confirmation of the crystalline phase by X-ray diffraction was then carried out. The oxygen content was measured by SIMS (secondary ionization mass spectroscopy).

The sample used in the test of initial-state characteristics was a ferroelectric capacitor fabricated according to the manufacturing method of the first embodiment. Eight types of samples were prepared. In the eight samples, the oxygen flow rates used at the time of electrode film formation were made 0, 2.5, 5, 10, 15, 20, 25 and 30 sccm (total flow rate: 45 sccm, with the remaining gas being Ar gas). Conditions (conditions regarding the buffer layers, bottom electrode and area of the ferroelectric capacitor) other than the atmosphere that is a condition for forming the top electrode were common for all samples. Table 5 below illustrates the results of the test of initial-state characteristics for each sample. Samples for which the oxygen flow rates are 0 and 30 sccm are for the purpose of comparison.

TABLE 5

RESULTS OF TEST OF INITIAL-STATE CHARACTERISTICS OF FERROELECTRIC CAPACITOR

| OXYGEN FLOW RATE AT FILM FORMATION OF TOP ELECTRODE (sccm) | OXYGEN CONTENT OF TOP ELECTRODE (X IN $Ru_{1-x}O_x$) | $P_{sw} - P_{nsw}$ ($\mu C/cm^2$) | LEAKAGE CURRENT DENSITY ($\mu A/cm^2$) |
|---|---|---|---|
| 0 | 0.00027 | 9.41 | $1.5 \times 10^{-6}$ |
| 2.5 | 0.0051 | 12.7 | $8.3 \times 10^{-7}$ |
| 5 | 0.014 | 15.6 | $9.1 \times 10^{-7}$ |
| 10 | 0.02 | 16.4 | $8.3 \times 10^{-7}$ |
| 15 | 0.027 | 17.4 | $9.8 \times 10^{-7}$ |
| 20 | 0.033 | 16.1 | $6.8 \times 10^{-7}$ |
| 25 | 0.047 | 15.0 | $8.9 \times 10^{-7}$ |
| 30 | 0.59 | 3.88 | $2.2 \times 10^{-5}$ |

With regard to evaluation of X-ray diffraction in the test of initial-state characteristics, samples (see Table 5) for which the oxygen flow rate ranges from 0 to 25 sccm were subjected to observation of Ru metal crystalline phase and to no observation of $RuO_2$ crystalline phase. The $RuO_2$ crystalline phase was observed with regard to the sample having the oxygen flow rate of 30 sccm.

Figure 4:
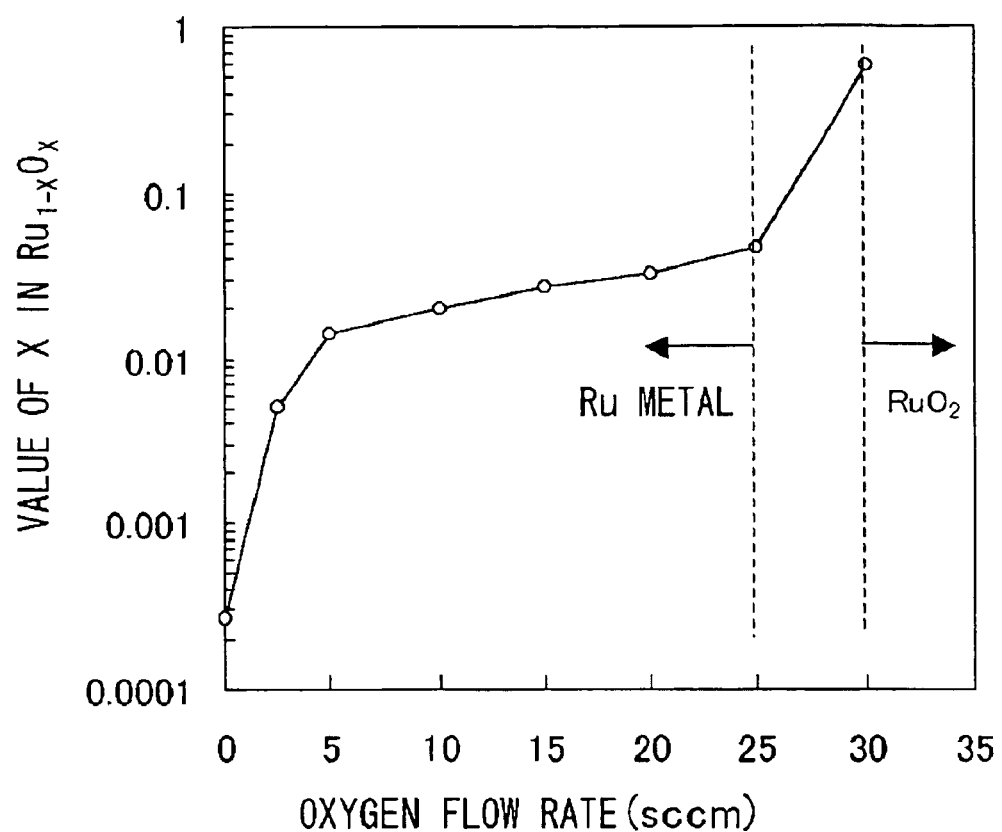
FIG. 4 is a graph illustrating the relationship between oxygen flow rate and oxygen content in a Table 5.

FIG. 4 illustrates the relationship between oxygen flow rate and oxygen content in Table 5. As shown in FIG. 4, the oxygen content of the top electrode rises sharply at an oxygen flow rate above 25 sccm. This signifies that it is difficult to control oxygen content of the top electrode by control of oxygen flow rate from the point at which oxygen flow rate exceeds 25 sccm. The oxygen content of the top electrode decreases sharply in the vicinity of an oxygen flow rate of 5 sccm. This means that it is difficult to control oxygen content of the top electrode by control of oxygen flow rate from the point at which oxygen flow rate is about 5 sccm. Accordingly, oxygen content can be controlled to a value of 0.5 to 5 atm % ($Ru_{1-x}O_x$; x=0.005 to 0.05) by controlling oxygen flow rate (or oxygen partial pressure within the range of oxygen flow rates of 5 to 26 sccm, where the variation in oxygen content is small. It should be noted that it is necessary to shift the range of oxygen flow rates depending upon such film forming conditions as temperature and oxygen partial pressure.

Figure 5:
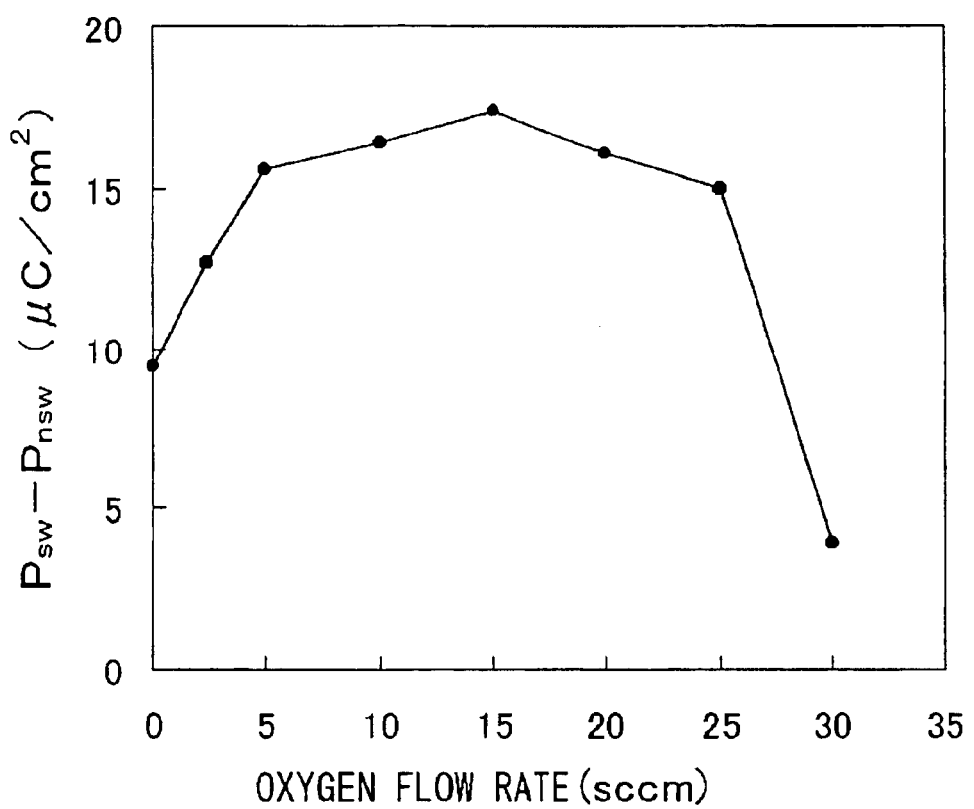
FIG. 5 is a graph illustrating the relationship between oxygen flow rate and amount of polarization in a Table 5.

FIG. 5 illustrates the relationship between oxygen flow rate and amount of polarization in Table 5. As shown in FIG. 5, the smaller the oxygen flow rate, the smaller the polarization value with regard to samples in a range in which the oxygen flow rate is less than 15 sccm (see FIG. 3). It will be understood that the polarization value is very small for the sample whose oxygen flow rate is 30 sccm.

Figure 6:
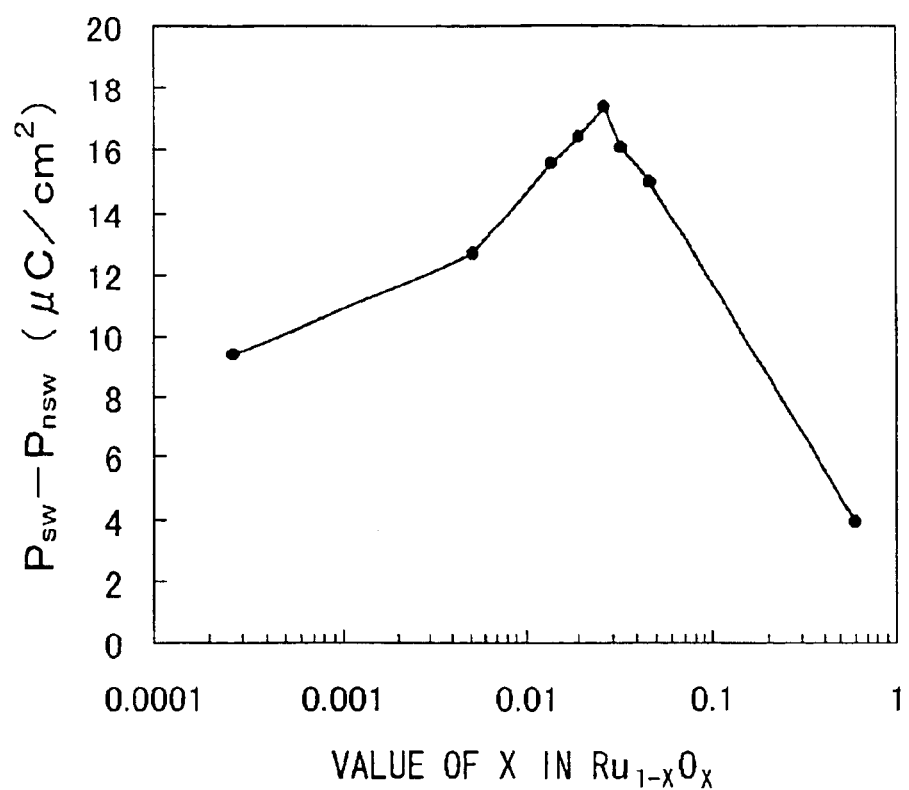
FIG. 6 is a graph illustrating the relationship between oxygen flow rate and amount of polarization in a Table 5.

FIG. 6 illustrates the relationship between oxygen content and amount of polarization in Table 5. It will be understood from FIG. 6 that an excellent ferroelectric capacitor for which the remanent polarization value is 10 $\mu C/cm^2$ or greater can be obtained in a range in which the oxygen content of the top electrode is 0.5 to 5 atm % ($Ru_{1-x}O_x$; x=0.005 to 0.05).

Figure 7:
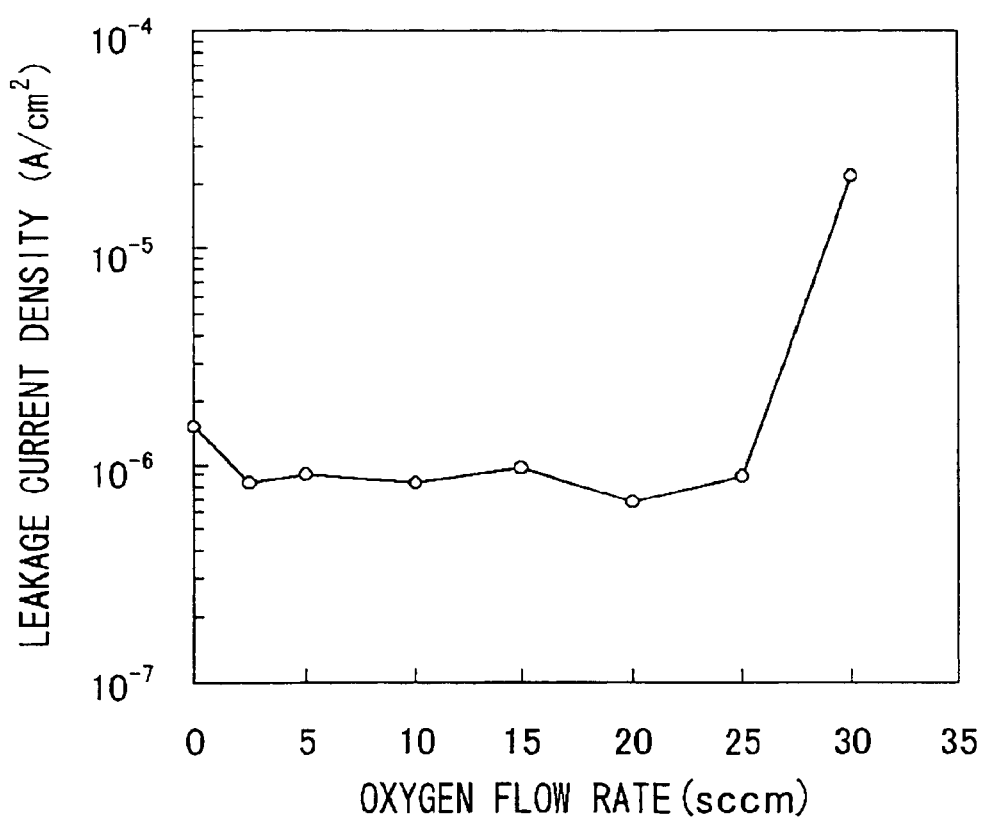
FIG. 7 is a graph illustrating the relationship between oxygen flow rate and leakage current density in a Table 5.

FIG. 7 illustrates the relationship between oxygen flow rate and leakage current density in Table 5. It will be understood from FIG. 7 that the leakage current density is high for the sample, which has the $RuO_2$ crystalline phase, whose oxygen flow rate is 30 sccm. It is believed that this is ascribable to the $RuO_2$ crystalline phase in the top electrode.

Figure 8:
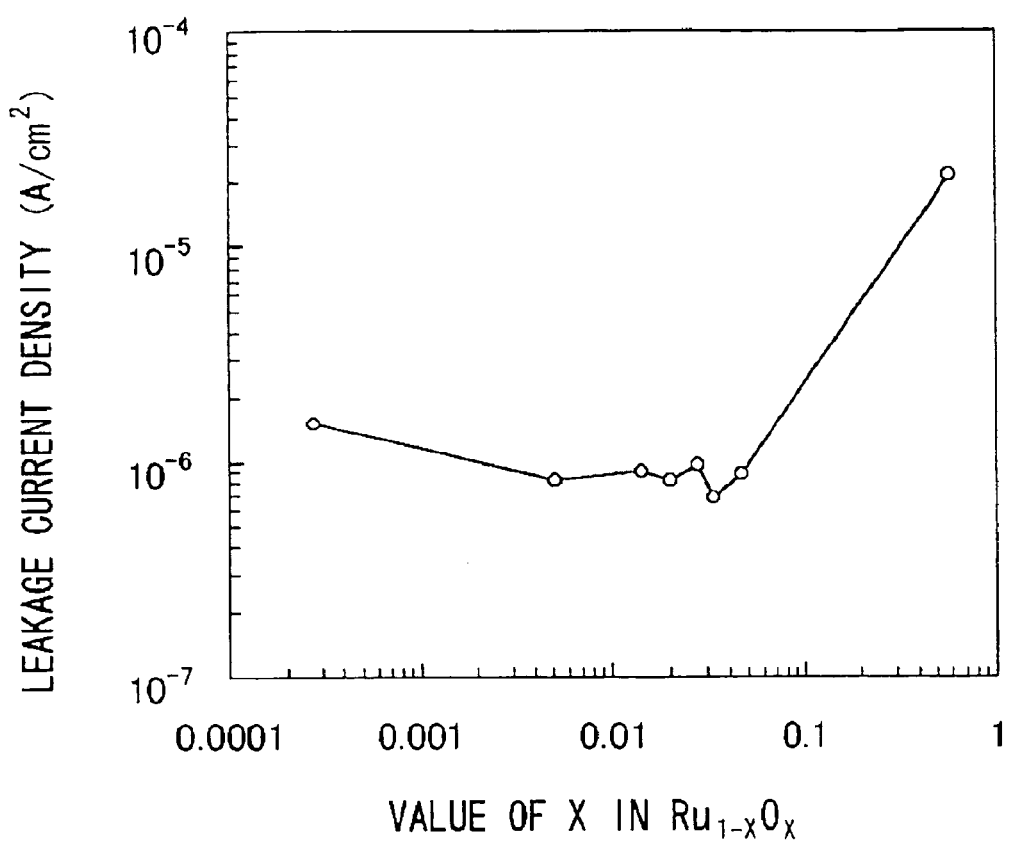
FIG. 8 is a graph illustrating the relationship between oxygen flow rate and leakage current density in a Table 5.

FIG. 8 illustrates the relationship between oxygen content and leakage current density in Table 5. It will be understood from FIG. 8 that an excellent ferroelectric capacitor for which the leakage current density is not high can be obtained in a range in which the oxygen content of the top electrode is 0.5 to 5 atm % ($Ru_{1-x}O_x$; x=0.005 to 0.05).

The test of polarization-reversal cycle characteristics will be described next. In the test of polarization-reversal cycle characteristics, the following were measured: charge at the time of polarization reversal (charge when +3.3 V has been applied after applying −3.3 V; see PSW in FIG. 3) when 3.3V bipolar pulses are applied 10 to the 8th times in succession, and charge at the time of polarization reversal (charge when +3.3 V has been re-applied after applying +3.3 V; see $P_{nsw}$ in FIG. 3).

Figure 9:
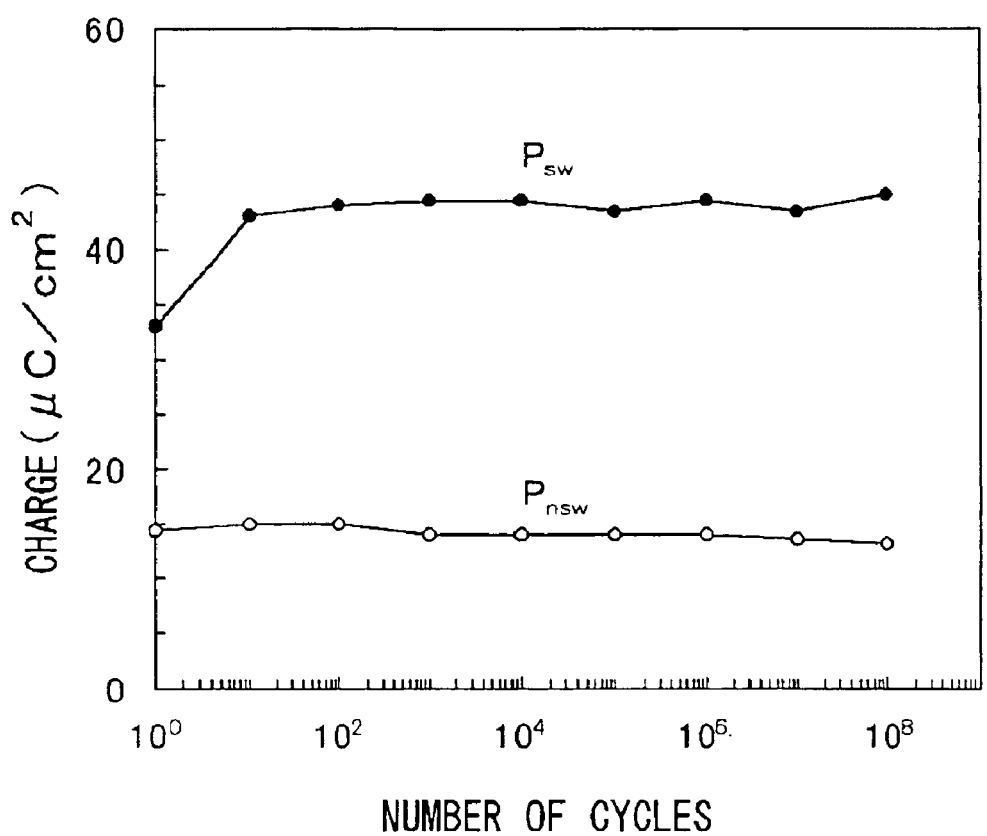
FIG. 9 is a graph illustrating the polarization reversal cycle characteristics of the ferroelectric capacitor according to the first embodiment.

The sample used in the test of polarization-reversal cycle characteristics was a ferroelectric capacitor fabricated according to the manufacturing method of the first embodiment. The sample was obtained by adopting 10 sccm (total flow rate: 45 sccm, with the remaining gas being Ar gas) as the oxygen flow rate at the time of formation of the top electrode (oxygen content: 2 atm %). FIG. 9 illustrates the polarization-reversal cycle characteristics obtained when this sample (the ferroelectric capacitor according to this invention) is used.

It will be understood from FIG. 9 that remanent polarization value ($P_{sw}-P_{nsw}$) increases initially and then remains substantially constant. A phenomenon (so-called fatigue phenomenon) in which polarization deteriorates with an increase in number of cycles is not observed.

Other embodiments of the invention will now be described.

In a second embodiment, the Ru metal of the first embodiment, which serves as the material used for the bottom electrode in the ferroelectric capacitor, is replaced by an Ru metal having a metal crystalline phase and including 0.5 to 5 atm % oxygen ($Ru_{1-x}O_x$; X 0.005 to 0.05). In this case also it is possible to obtain a ferroelectric capacitor in which there is no increase in leakage current density, degradation of polarization is not observed, polarization of the ferroelectric thin film is readily reversed and polarization reversal charge can be increased.

In a third embodiment, the invention is applicable to a perovskite-type ferroelectric having PZT as the main component, instead of PZT of the first embodiment, as the material used for the ferroelectric thin film in the ferroelectric capacitor. For example, the invention is applicable to a ferroelectric having a composition obtained by adding an additive such as La, Ba, Ca, Nb, Ta or Mn to PZT. In this case, the polarization of the ferroelectric thin film is readily reversed and the polarization-reversal charge can be increased while the dielectric property is controlled.

In a fourth embodiment, the invention is applicable to a thin film having Ir as the main component, instead of Ru of the first embodiment, as the material used for the top electrode or bottom electrode in the ferroelectric capacitor. In the case of Ir also it is possible to obtain a metal having a metal crystalline phase, containing oxygen and containing no metal oxide.

In a fifth embodiment, the top or bottom electrode of the ferroelectric capacitor can be formed by the MOCVD method instead of the sputtering method used in the first embodiment. The film forming conditions are as shown in Table 6 below.

TABLE 6

FILM FORMING CONDITIONS OF ELECTRODE LAYER BY MOCVD METHOD

| | |
|---|---|
| RAW MATERIAL | BIS(ETHYL CYCLOPENTADIENYL) RUTHENIUM; Ru (EtCp)$_2$ |
| RAW-MATERIAL CRACKED GAS | O$_2$ |
| RAW-MATERIAL CARRIER GAS | Ar |
| TEMPERATURE | 300° C. |
| PRESSURE | 3 Torr (400 Pa) |
| FILM FORMING RATE | 20 nm/min |

Since oxygen is used as a source decomposition gas, oxygen can be included in the Ru metal film. The amount of oxygen mixed in the Re metal film (the oxygen content) can be controlled by controlling the amount of oxygen supplied (the amount of cracked gas supplied) during the film deposition. Moreover, since the step coverage property is improved over that obtained with the sputtering method, a structure other than a planar structure, e.g., a stacked structure, trench structure, crown structure or fin structure, can be made.

A sixth embodiment of the present invention will now be described with reference to the drawings.

Figure 10:
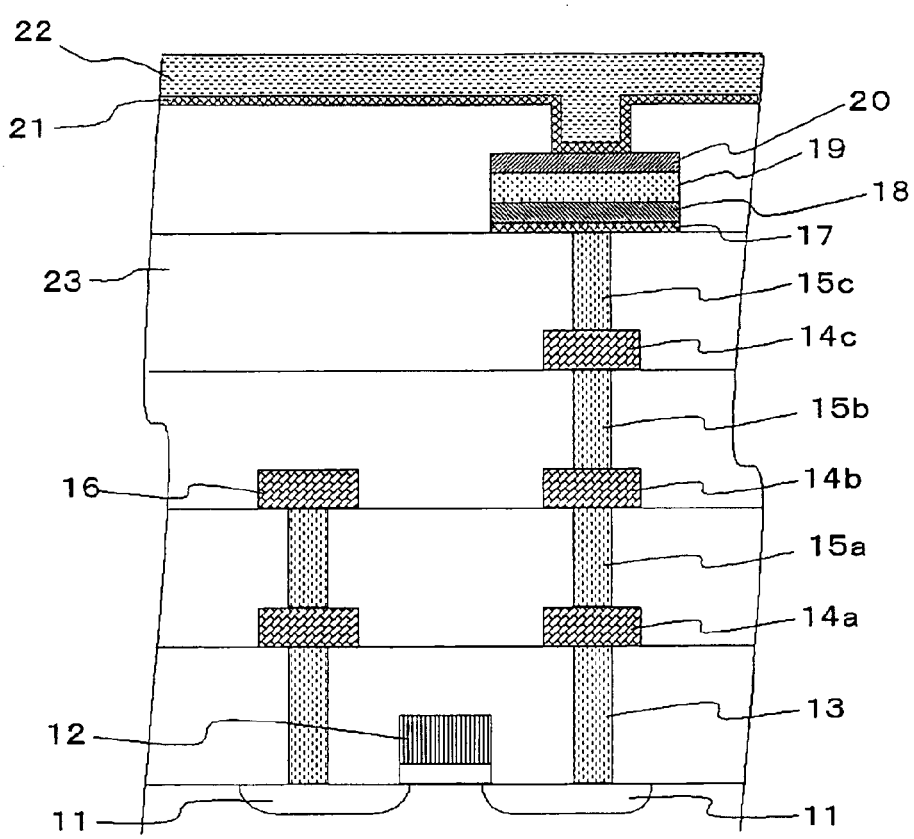
FIG. 10 is a partial sectional view schematically illustrating the structure of a ferroelectric memory cell (planar-structure capacitor) according to a sixth embodiment of the present invention.

FIG. 10 is a partial sectional view schematically illustrating the structure of a ferroelectric memory cell (planar-structure capacitor) according to a sixth embodiment of the present invention. In this ferroelectric memory cell, a bottom electrode 18, ferroelectric thin film 19 and top electrode 20, which compose a planar-type (parallel-plate) ferroelectric capacitor, are formed on an insulting layer 23 (a third via plug 15c) having a flat top surface via a barrier layer 17 in a multi-layer interconnection structure. Ru metal including 0.5 to 5 atm % oxygen ($Ru_{1-x}O_x$; x=0.005 to 0.05) can be used as the bottom electrode 18 or ferroelectric thin film 19.

A seventh embodiment will now be described with reference to the drawings.

Figure 11:
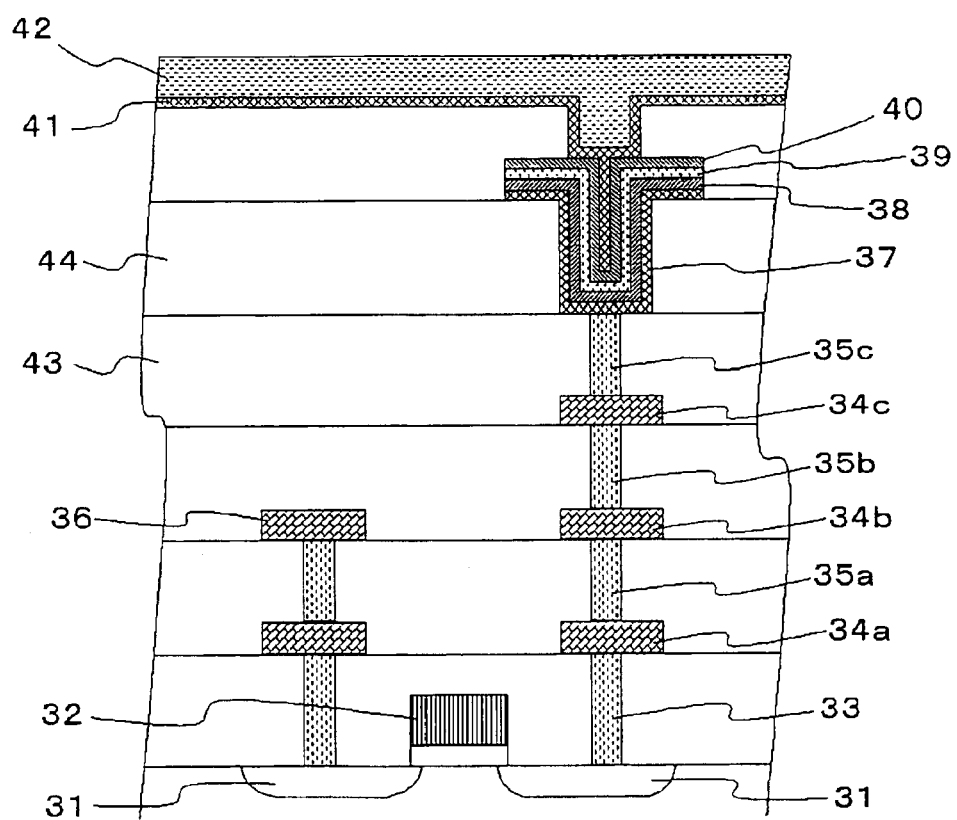
FIG. 11 is a partial sectional view schematically illustrating the structure of a ferroelectric memory cell (a capacitor having a three-dimensional structure) according to a seventh embodiment of the present invention.
Figure 12:
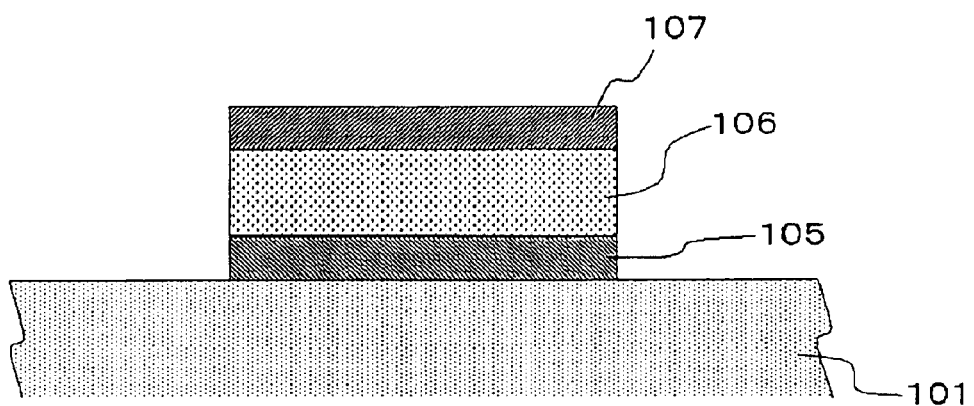
FIG. 12 is a partial sectional view schematically illustrating the structure of a ferroelectric capacitor according to an example of the prior art.

FIG. 11 is a partial sectional view schematically illustrating the structure of a ferroelectric memory cell (a capacitor having a three-dimensional structure) according to a seventh embodiment of the present invention. This ferroelectric memory cell has an insulating layer 44 provided with a trench in which a third via plug 35c and part of an insulating layer 43 are exposed in a multi-layer interconnection structure, and a bottom electrode 38, ferroelectric thin film 39 and top electrode 40, which constitute a three-dimensional (trench-type) ferroelectric capacitor, is formed on the trench surface or on the insulating layer 44 in the vicinity thereof via a barrier layer 37.

In the seventh embodiment, Ru metal including 0.5 to 5 atm % oxygen ($Ru_{1-x}O_x$; x=0.005 to 0.05) can be used as the bottom electrode 38 or ferroelectric thin film 40 (see FIG. 11). Even though the bottom electrode 38 and top electrode 40 have a dent such as a trench, film can be formed by the MOCVD method while the step coverage property is maintained, as illustrated in the fifth embodiment. Moreover, the oxygen content of the bottom electrode 38 or top electrode 40 can be controlled over a range of 0.5 to 5 atm % ($Ru_{1-x}O_x$; x=0.005 to 0.05) by the MOCVD method. Also, in regard to the ferroelectric thin film 39, the film can be formed by the MOCVD method while maintaining an excellent step coverage property. As a result, the surface area of the capacitor can be increased and capacitance enlarged. This makes it possible to reduce cell size.

The meritorious effects of the present invention are summarized as follows.

Thus, in accordance with the present invention, Ru metal that includes 0.5 to 5 atm % oxygen ($Ru_{1-x}O_x$; x=0.005 to 0.05) is used as the electrodes in a ferroelectric capacitor. As a result, it is possible to obtain a ferroelectric capacitor in which there is no increase in leakage current density, degradation of polarization is not observed, polarization of the ferroelectric thin film is readily reversed and polarization reversal charge can be increased.

Further, if the oxygen content of the electrodes in the ferroelectric capacitor ranges from 0.5 to 5 atm % ($Ru_{1-x}O_x$; x=0.005 to 0.05), it is possible to improve stability of characteristics when the ferroelectric capacitor is formed and in processes such as subsequent dry-etching and heat treatment.

Furthermore, since a three-dimensional capacitor can be formed, capacity can be increased by increasing the surface area of the capacitor. This makes it possible to reduce cell size.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A ferroelectric capacitor having a bottom electrode, a ferroelectric thin film provided on the bottom electrode, and a top electrode provided on the ferroelectric thin film, wherein said top electrode comprises an Ru metal crystalline phase and 0.5–5 atm % interstitial oxygen atoms in the RU metal crystalline phase.

2. The capacitor according to claim 1, wherein said ferroelectric thin film includes $Pb(Zr_y Ti_{1-y})O_3$ (where, y is a predetermined number of $0<y<1$) as a main component.

3. The capacitor according to claim 1, wherein said bottom electrode, ferroelectric thin film and top electrode are built up on an area that includes a step portion or trench.

4. A semiconductor memory device comprising one or more of the ferroelectric capacitors set forth in claim 1.

5. A ferroelectric capacitor having a bottom electrode, a ferroelectric thin film provided on the bottom electrode, and a top electrode provided on the ferroelectric thin film, wherein either one or both of said top electrode and bottom electrode comprises an Ru metal crystalline phase and 0.5–5 atm % interstitial oxygen atoms in the RU metal crystalline phase.

6. The capacitor according to claim 5, wherein said ferroelectric thin film includes $Pb(Zr_y Ti_{1-y})O_3$ (where, y is a predetermined number of $0<y<1$) as a main component.

7. The capacitor according to claim 5, wherein said bottom electrode, ferroelectric thin film and top electrode are built up on an area that includes a step portion or trench.

8. A semiconductor memory device comprising one or more of the ferroelectric capacitors set forth in claim 5.

9. A ferroelectric capacitor having a bottom electrode, a ferroelectric thin film provided on the bottom electrode, and a top electrode provided on the ferroelectric thin film, wherein said top electrode comprises a metal that has a metal crystalline phase, contains interstitial oxygen atoms in the metal crystalline phase, and is devoid of a metal oxide crystalline phase.

10. The ferroelectric capacitor according to claim 9, wherein a main component of said metal is at least one element selected from Ir and Ru.

11. The capacitor according to claim 9, wherein said ferroelectric thin film includes $Pb(Zr_y Ti_{1-y})O_3$ (where, y is a predetermined number of $0<y<1$) as a main component.

12. The capacitor according to claim 9, wherein said bottom electrode, ferroelectric thin film and top electrode are built up on an area that includes a step portion or trench.

13. A semiconductor memory device comprising one or more of the ferroelectric capacitors set forth in claim 9.

14. A ferroelectric capacitor having first and second electrodes, and a ferroelectric thin film arranged between said first and second electrodes, wherein at least one of said first and second electrodes comprises a metal that has a metal crystalline phase, contains interstitial oxygen atoms in the metal and crystalline phase, and is devoid of a metal oxide crystalline phase.

15. The ferroelectric capacitor according to claim 14, wherein a main component of said metal is at least one element selected from Ir and Ru.

16. The ferroelectric capacitor according to claim 14, wherein said metal is Ru, said metal crystalline phase is an Ru metal crystalline phase, and the oxygen content in said Ru metal crystalline phase is in a range of 0.5–5 atm %.

17. The capacitor according to claim 14, wherein said ferroelectric thin film includes $Pb(Zr_y Ti_{1-y})O_3$ (where, y is a predetermined number of $0<y<1$) as a main component.

18. The capacitor according to claim 14, wherein said first electrode, ferroelectric thin film and second electrode are built up on an area that includes a step portion or trench.

19. A semiconductor memory device comprising one or more of the ferroelectric capacitors set forth in claim 14.

* * * * *